United States Patent [19]
Noda et al.

[11] Patent Number: 5,939,952
[45] Date of Patent: Aug. 17, 1999

[54] FLAT FLEXIBLE CABLE WITH PSEUDO-TWISTED CONDUCTORS

[75] Inventors: Atsuhito Noda, Hachiohji; Tetsuo Hoshino, Atsugi, both of Japan

[73] Assignee: Molex Incorporated, Lisle, Ill.

[21] Appl. No.: 08/861,291

[22] Filed: May 21, 1997

[30] Foreign Application Priority Data

May 24, 1996 [JP] Japan ................................. 7-153069

[51] Int. Cl.⁶ .................................................. H01P 3/02
[52] U.S. Cl. ........................... 333/1; 174/33; 174/250; 333/12; 333/236; 333/238
[58] Field of Search .................. 333/1, 12, 4, 5, 333/34, 236, 238, 246; 174/32, 33, 117 FF, 250, 253

[56] References Cited

U.S. PATENT DOCUMENTS

| 3,617,952 | 11/1971 | Beech .................................... 333/34 X |
| 3,761,842 | 9/1973 | Gandrud ..................................... 333/1 |
| 3,764,727 | 10/1973 | Balde ............................. 174/117 FF X |
| 5,397,862 | 3/1995 | Bockelman et al. .................. 174/33 X |

FOREIGN PATENT DOCUMENTS

| 5-120928 | 5/1993 | Japan . |
| 6-111642 | 4/1994 | Japan . |

*Primary Examiner*—Paul Gensler
*Attorney, Agent, or Firm*—Charles S. Cohen

[57] ABSTRACT

A flat flexible electrical cable includes a pair of pseudo-twisted conductors on a flexible dielectric substrate. Each conductor includes alternate straight and oblique sections. The straight sections of the conductors are generally parallel to each other and of uniform width. The oblique sections of the conductors cross each other at a crossover point. Each oblique section of each conductor is reduced in width uniformly in a direction from the straight-to-oblique transfer point of the respective conductor to the crossover point of the conductors.

24 Claims, 5 Drawing Sheets

FLAT FLEXIBLE CABLE WITH PSEUDO-TWISTED CONDUCTORS

FIELD OF THE INVENTION

This invention generally relates to the art of electrical cables and, particularly, to a flat flexible cable having at least a pair of pseudo-twisted conductors constructed to have a substantially constant impedance along the length of the cable.

BACKGROUND OF THE INVENTION

High speed data transmission between complex electronic gear such as computers and their peripherals is commonly achieved through round multi-conductor cable assemblies. Inherent with high speed data transmission and multi-conductor cables are problems associated with electromagnetic interference. The interference between conductors can create "cross talk" and "noise", which can cause erroneous data transmission.

One type of cable used to reduce such effects is "twisted pair" cable, where two adjacent conductors or differential pairs are twisted, thereby reversing the lateral position of each conductor at each twist. The benefits of this configuration are two fold.

First, the position of the wires is constantly being reversed. Therefore any exterior magnetic or electric field has a generally uniform effect upon a given differential pair. This uniformity reduces the harmful effects of exterior electromagnetic fields and lessens the chances of erroneous data transmission.

Second, when current runs through a conductor, an electromagnetic field is generated. The field's orientation is dependent upon the direction of the current flow. For a given differential pair, electric currents generally flow in opposite directions. Therefore, the electromagnetic field radiating from each conductor generally has a canceling effect upon the other. This canceling effect can substantially suppress the radiated emissions from a given differential pair.

Flat flexible cable or circuitry (FFC) is another medium used for high speed data transmission between computers and their peripherals. A "pseudo-twisted" arrangement can be achieved with FFC by placing conductors of a given pair on opposite sides of the insulative carrier, with their paths slightly and oppositely offset with respect to a common nominal path locator, and then periodically reversing the offset at predetermined locations. An example of the "pseudo-twisted" flat flexible cable arrangement is shown in U.S. Pat. No. 3,761,842, dated Sep. 25, 1973. The characteristic impedance of flat flexible cable can affect the integrity of the signals travelling in the cable. One of the factors that influences the characteristic impedance of a given pair of conductors of a pseudo-twisted FFC is the centerline distance "L" (FIG. 3A—CASE 2) between conductors. In FIG. 3A, cable "B" includes pseudo-twisted conductors "P" that are positioned on opposite sides of a flexible substrate "d" with adhesive layers "e" and "c" interposed therebetween. The conductors are covered by protective films "a" and "g" with adhesive layers "b" and "f" interposed therebetween. The lateral distance "D" between the conductors on opposite sides of a prior art pseudo-twisted FFC varies along the length of the cable, as indicated by 0.2, 0.16 and 0 mm. If conductors "P" have constant widths and thicknesses along their lengths, the impedance "Z" decreases with a decrease in the conductor-to-conductor distance "D" (See FIG. 3B). Therefore, at every crossing point or "twist" of the conductors, the characteristic impedance decreases. Accordingly, the more twists per unit length of FFC, the lower the characteristic impedance for that given length.

U.S. Pat. No. 3,761,842 discloses a pseudo-twisted FFC having pairs of conductors, each pair having a differing numbers of twists per unit length. Characteristic impedance for a given pair of conductors in a pseudo-twisted FFC is also a function of the lateral width of the conductor paths. A reduction in the lateral width of the conductors increases the characteristic impedance for the given pair. U.S. Pat. No. 3,761,842 also teaches that if the conductor width at the crossing point is decreased, the characteristic impedance at that point is increased. This relationship allows the user to construct a cable where the characteristic impedance per unit length is independent of the number of twists per unit length. Accordingly, a cable with many twists per unit length would have the lateral width of the conductors at the crossing point reduced more than a cable with fewer twists per unit length. While the pseudo-twisted FFC of U.S. Pat. No. 3,761,842 has some advantages over the prior art, because of the abrupt reduction in the width of the conductors, the impedance will also change abruptly. This is undesirable in many applications such as in high speed data transmission where it is desirable to have a cable whose characteristic impedance is constant through out the length of the cable. The present invention is directed to providing a pseudo-twisted FFC having a characteristic impedance that is independent of the number of twists per unit length and substantially constant through out the length of the cable.

Additional prior art pseudo-twisted FFC cables are disclosed in Japanese Patent Publication Nos. 5-120928 and 6-111642.

SUMMARY OF THE INVENTION

An object, therefore, of the invention is to provide a new and improved flat flexible cable having at least a pair of pseudo-twisted conductors constructed to have a substantially constant impedance along the length of the cable.

In the exemplary embodiment of the invention, the pair of pseudo-twisted conductors are disposed on a flexible dielectric substrate, with one conductor being on one side of the substrate and the other conductor being on the other side of the substrate. Each conductor includes alternate straight and oblique sections. The straight sections of the conductors are generally parallel to each other. The oblique sections of the conductors cross each other at a crossover point. Each oblique section of each conductor is reduced in width uniformly in a direction from the straight-to-oblique transfer point of the respective conductor to the crossover point of the conductors.

By reducing the width of the oblique sections of the conductors uniformly from the straight-to-oblique transfer points to the crossover points, abrupt changes in the impedance lengthwise of the conductors are eliminated. The impedance, therefore, is substantially constant along the full length of the pair of pseudo-twisted conductors.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
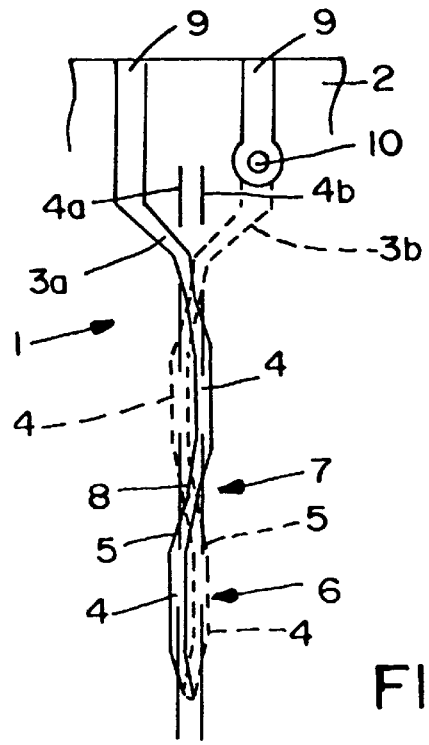
FIG. 1 is an enlarged plan view of a pair of pseudo-twisted conductors along a length thereof involving two pseudo-twists of the conductors.
Figure 2:
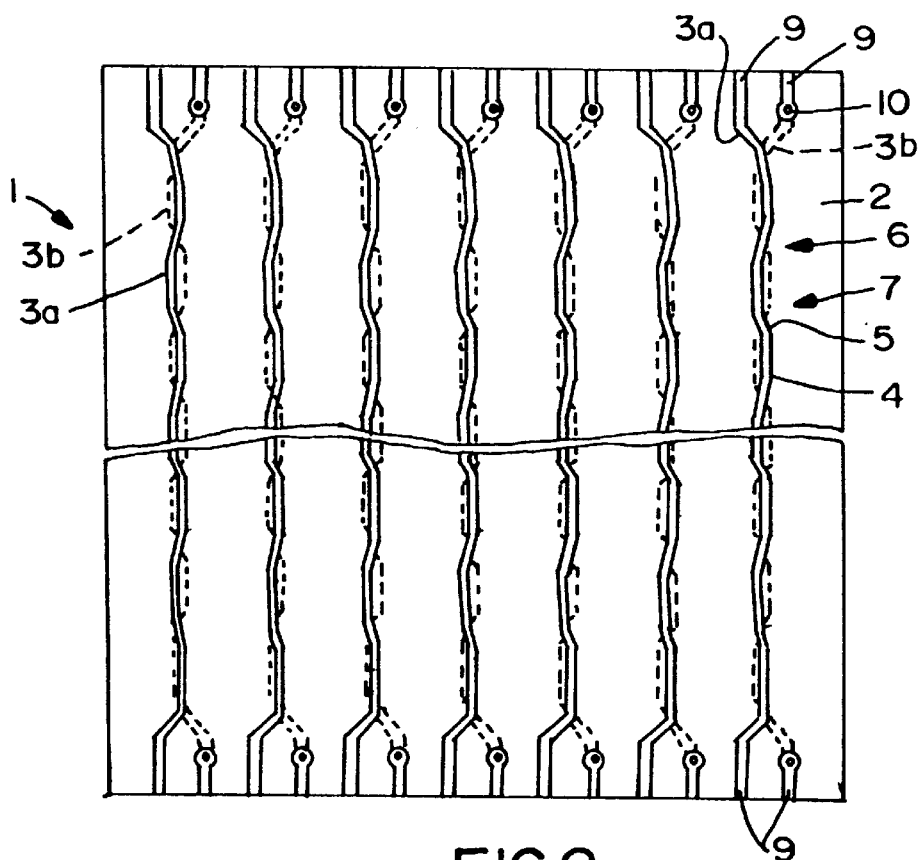
FIG. 2 is a fragmented plan view of a flat flexible cable incorporating a plurality of pairs of pseudo-twisted conductors.
Figure 3A:
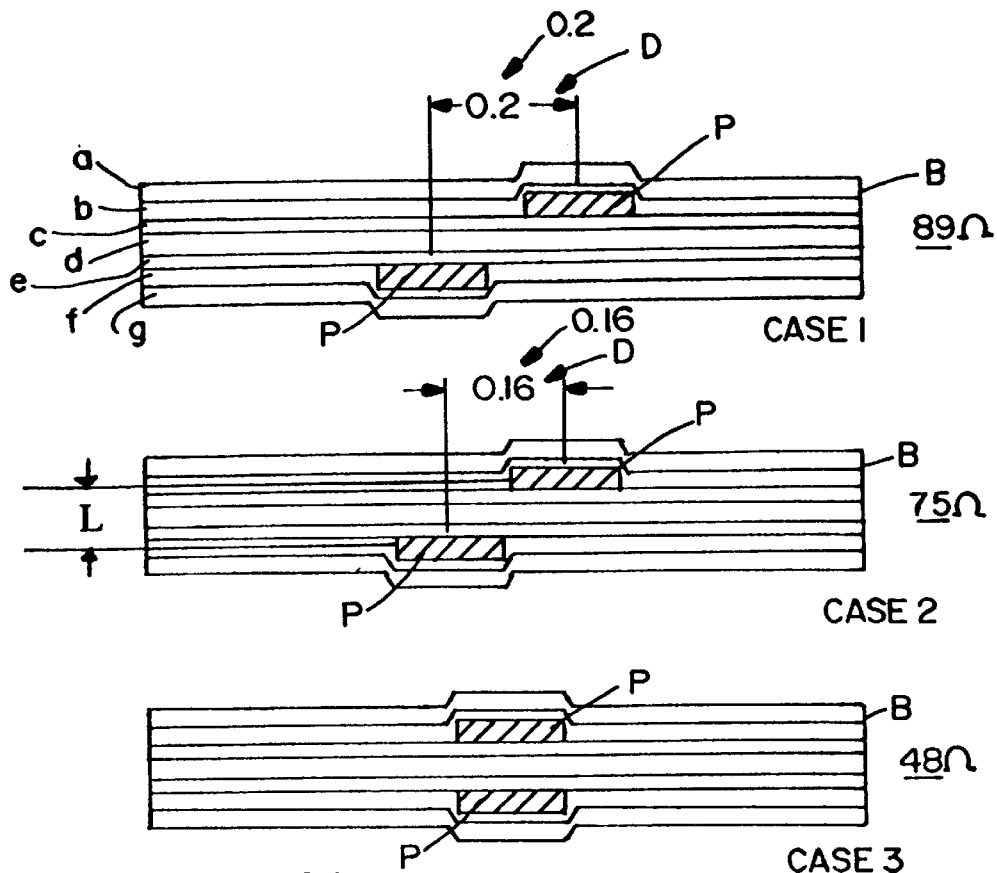
FIG. 3A shows various generally schematic cross sections of a pair of cable conductors from a pseudo-twisted cable of the prior art.
Figure 4:
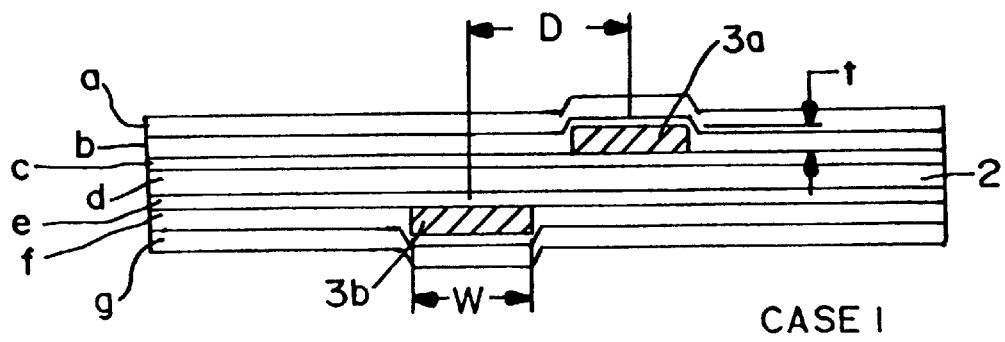
FIG. 4 shows various cross sections similar to FIG. 3A but of a pair of cable conductors from a pseudo-twisted cable of the present invention.
Figure 4:
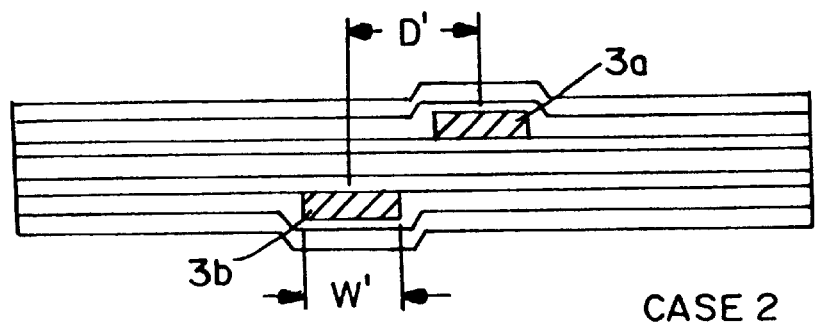
Figure 4:
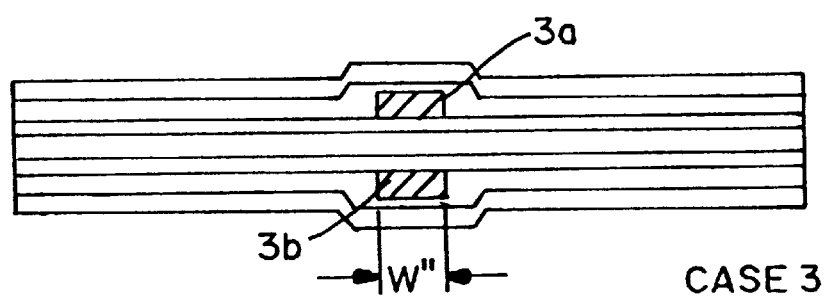
Figure 5:
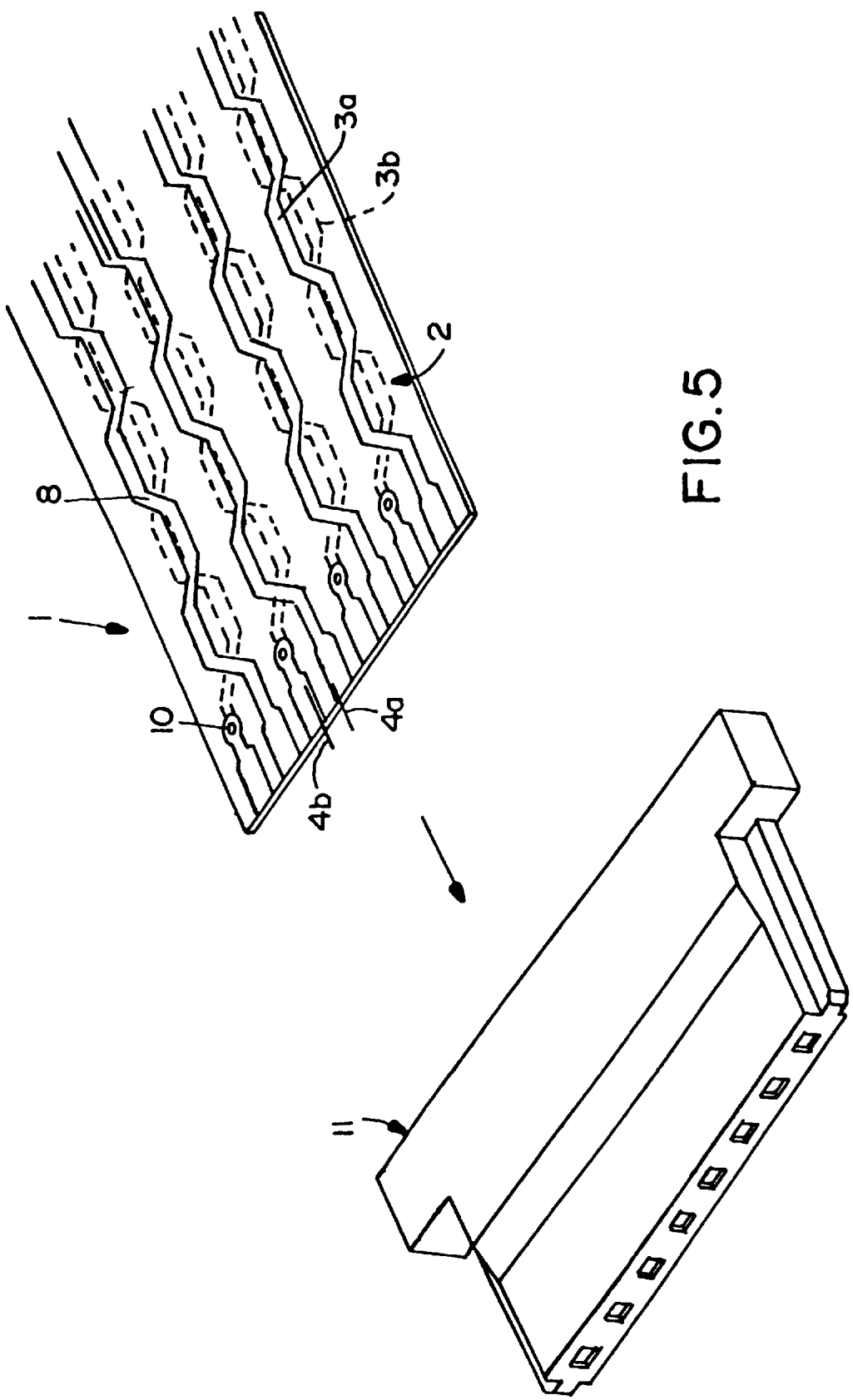
FIG. 5 is a fragmented perspective view of the pseudo-twisted cable of the present invention together with a connector to which it could be connected.

Referring to the drawings in greater detail, and first to FIGS. 1, 2 and 5, a flat flexible cable, generally designated 1, includes a plurality of pairs of pseudo-twisted conductors 3a and 3b. One conductor 3a is disposed on one side or surface of a flexible dielectric substrate 2, and the other conductor 3b is disposed on the other side or surface of the substrate. The cross-section of each cable is similar to that of the prior art pseudo-twisted cable B shown in FIG. 3A. Accordingly, like reference letters have been applied to FIG. 4 to designate like layers of the cable. In other words, each pair of conductors 3a and 3b is sandwiched between flexible substrate d and protective films a and g, respectively, therebetween to form a pair of pseudo-twisted conductors.

As best seen in FIG. 1, each conductor 3a and 3b runs lengthwise of the cable in an oscillating pattern formed by alternate straight sections 4 and oblique sections 5. These patterns of conductors 3a and 3b are arranged symmetrically but opposite to each other on opposite sides or surfaces of the flexible substrate. The straight sections 4 of each conductor are generally parallel to each other but alternate along two parallel but spaced apart lines 4a and 4b as shown in FIGS. 1 and 5. The oblique sections 5 of each conductor connects a pair of adjacent straight sections 4 and thus extends between lines 4a and 4b. Since the conductors 3a and 3b are arranged symmetrically but opposite to each other, the straight sections 4 of the conductors are generally parallel but spaced apart both vertically and horizontally. In other words, when the straight section 4 of one conductor 3a is aligned with line 4a, the straight section 4 of the other conductor 3b is aligned with line 4b but on opposite sides of substrate 2, and vice versa. As a result, the oblique sections 5 of the conductors 3a and 3b cross each other at crossover points 8.

Figure 6:
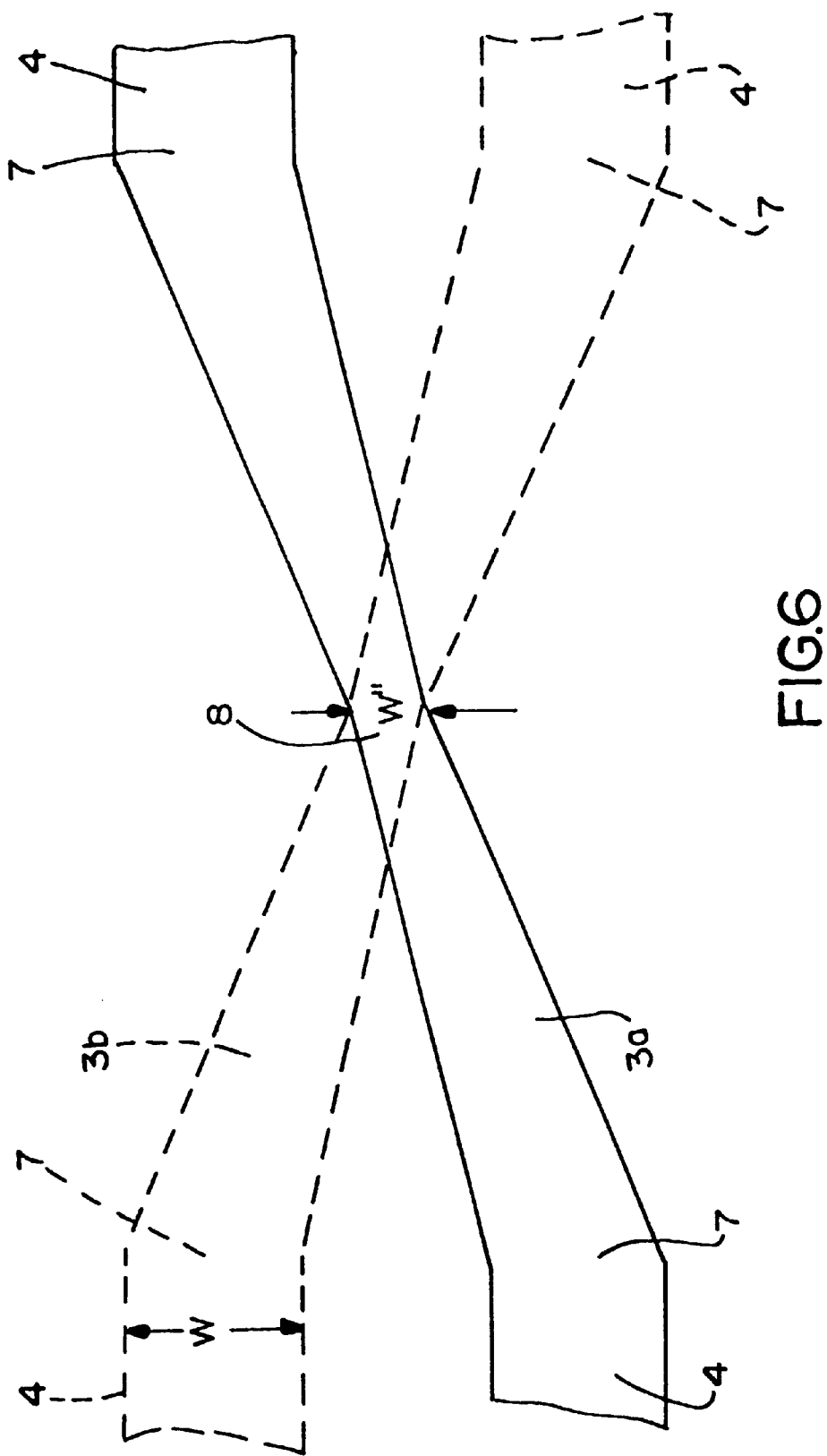
FIG. 6 is an enlarged, fragmented plan view of a schematic representation of a portion of a pair of conductors of a pseudo-twisted cable of the present invention.

The straight sections 4 of conductors 3a and 3b have uniform or equal widths along the lengths thereof. As best shown in FIG. 6, each oblique section 5 of each conductor decreases in width uniformly in a direction from the straight-to-oblique transfer point 7 of the respective conductor to the respective crossover point 8 of the conductors where it reaches its minimum width. Assuming that: 1) the thickness "t" (FIG. 4) of conductors 3a and 3b (i.e., in a direction perpendicular to the plane of the cable) is uniform along the full length of the conductors; 2) the vertical distance between the conductors remains constant; and 3) the dielectric constant of the material between the conductors remains constant, the impedance increases with the decrease in the width of each oblique section 5.

The conductors 3a and 3b separately terminate in one of the pads 9 at an edge of flexible substrate 2. The pads of some of the conductors may include an associated through hole or via 10. These pads 9 are arranged at equal intervals along the edges of the flat flexible cable for engagement with equally spaced contacts (not shown) of an associated electrical connector 11 (FIG. 5) adapted for connecting to flat flexible cables. Therefore, either opposite edge of the flat flexible cable having the pseudo-twisted conductors can be inserted into the electrical connector to establish a required electrical connection.

It can be understood that as the juxtaposed oblique sections 5 of conductors 3a and 3b in each pseudo-twisted pair get closer to each other at each crossover point 8, the conductor-to-conductor centerline distance "D" decreases and, thereby, the impedance decreases. However, since each oblique section 5 is uniformly reduced in width, the impedance is caused to uniformly increase. In other words, as the oblique sections 5 of each pair of conductors get closer to each other toward each crossover point 8 (thus decreasing the conductor-to-conductor centerline distance), the impedance is decreasing and, at the same time, as the width or lateral dimension "W" (FIG. 4) of the oblique sections decreases toward the crossover point, the impedance uniformly increases. In essence, the impedance decreases due to the reduction in the relative distance between the centerlines of the conductors and simultaneously increases due to the gradual tapering or narrowing of the conductors in a balancing condition or a net effect of zero such that the impedance substantially remains unchanged from the straight-to-oblique transfer points 7 to the crossover points 8 of the pseudo-twisted conductors 3a and 3b. The impedance is preferably set to be equal to the impedance in parallel sections 4 of the pseudo-twisted conductor patterns so that the pseudo-twisted cable has a constant impedance along its entire length.

Figure 3B:
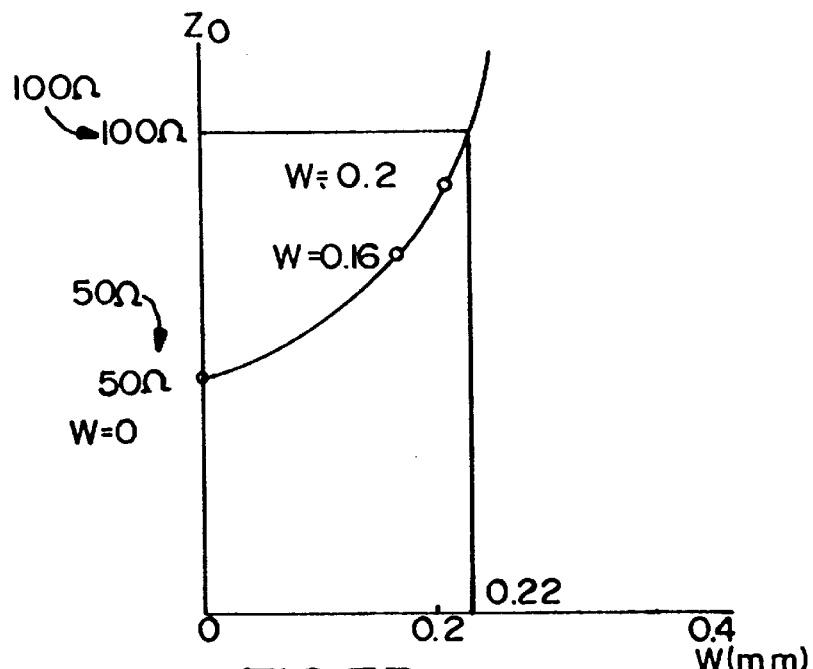
FIG. 3B is a graph comparing impedance with the lateral distance between conductors of the prior art pseudo-twisted cable of FIG. 3A.

One example of a pseudo-twisted cable 1 according to the present invention is shown in FIG. 4 and was designed so as to have an impedance of 100 Ω. As shown in Case 1 of FIG. 4, the width of the straight sections W of each conductor 3a and 3b was 0.15 mm and each straight section was 1.0 mm long. Each oblique section 5 (FIG. 1) was 1.0 mm long. Therefore, the distance from a straight-to-oblique transfer point 7 to a crossover point 8 was 0.5 mm long. The distance D between the parallel straight sections was 0.22 mm (Case 1 of FIG. 4). This distance was determined in consideration of the data as shown in FIG. 3B. As shown in Case 3 of FIG. 4, the impedance was reduced in half to represent a zero distance between the conductors. The width of each oblique section 5 was reduced gradually or uniformly from 0.15 mm at the straight-to-oblique transfer point 7 to a width W" of 0.072 mm at the crossover point 8 as shown in Case 3 of FIG. 4. In Case 3 of FIG. 4, the distance between the centerlines of the conductors 3a and 3b is 0.0 mm. Case 2 of FIG. 4 shows a location between the straight-to-oblique transfer point 7 and crossover point 8 wherein the distance D between conductors 3a and 3b as well as their width W is between those dimensions of Cases 1 and 3 of FIG. 4. A pseudo-twisted cable thus obtained was found to have a constant or uniform impedance along its full length.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

We claim:

1. A flat flexible electrical cable, comprising:

first and second pseudo-twisted flexible conductors on a flexible dielectric substrate having first and second opposite sides, said first conductor being on said first side of the substrate and said second conductor being on said second side of the substrate, each conductor including alternating straight and oblique sections with a straight-to-oblique intersection between said straight and oblique sections, the straight sections of the conductors being generally parallel to each other and of uniform width, the oblique sections of the conductors crossing each other at a crossover point, and each oblique section of each conductor decreasing in width uniformly in a direction from said straight-to-oblique intersection of the respective conductor to an adjacent crossover point of the conductors.

2. The flat flexible electrical cable of claim 1, including dielectric flexible films covering the outsides of the conductors.

3. The flat flexible electrical cable of claim 2, further including an adhesive between said flexible dielectric substrate and said flexible conductors and between said flexible conductors and said flexible films.

4. The flat flexible electrical cable of claim 1, wherein said crossover points define a centerline generally parallel to said straight sections of said conductors, and said straight sections of said first conductor being positioned in an alternating manner in two lines generally parallel to and on opposite sides of said centerline, said straight sections of said second conductor being positioned in an alternating manner in two lines generally parallel to and on opposite sides of said centerline, each of the straight sections of said first conductor being positioned on an opposite side of said centerline relative to said straight sections of said second conductor.

5. The flat flexible electrical cable of claim 1, wherein said cable includes a plurality of said first and second conductors.

6. The flat flexible electrical cable of claim 5, further including dielectric flexible films covering the outsides of said plurality of first and second conductors.

7. The flat flexible electrical cable of claim 6, wherein said crossover points of each of said first and second conductors define a centerline generally parallel to said straight sections of said conductors, and said straight sections of each of said first conductors being positioned in an alternating manner in two lines generally parallel to and on opposite sides of said centerline, said straight sections of each of said second conductors being positioned in an alternating manner in two lines generally parallel to and on opposite sides of said centerline, each of the straight sections of each of said first conductors being positioned on an opposite side of said centerline relative to said straight sections of each of said second conductors.

8. A generally planar flat flexible electrical cable, comprising:

a plurality of pairs of first and second pseudo-twisted flexible conductors generally positioned within a plane, said first and second conductors being spaced apart in a direction generally perpendicular to said plane and having a flexible dielectric substrate between said conductors and within said plane, said conductors having a periodic shape with said first conductors being shifted longitudinally relative to said second conductors by one half of a period of said shape, said first and second conductors including a crossover point at which said first and second conductors of each pair cross over each other and are separated by said flexible dielectric substrate, said crossover points of each pair defining a centerline with said first and second conductors reversing locations on opposite sides of said centerline, each said conductor including a transition section extending from a peak location a maximum distance from its respective centerline to said crossover point, said transition section decreasing in width uniformly in a direction from said peak location to said crossover point whereby the width of each said conductor is at a maximum at said peak location and at a minimum at said crossover point; and a dielectric flexible film covering the outsides of the conductors.

9. The generally planar flat flexible electrical cable of claim 8, wherein each said conductor includes alternating straight and oblique sections, said oblique sections crossing the centerline of each pair of conductors and said straight sections of each conductor being alternatingly positioned on opposite sides of said centerline.

10. The flat flexible electrical cable of claim 9, further including an adhesive between said flexible dielectric substrate and said flexible conductors and between said flexible conductors and said flexible films.

11. The flat flexible electrical cable of claim 10, further including an adhesive between said flexible dielectric substrate and said flexible conductors and between said flexible conductors and said flexible films.

12. A flexible printed circuit member, comprising:

an elongated flexible dielectric substrate having first and second opposite sides with at least one axis therealong;

a first flexible conductor disposed on said first side of said dielectric substrate, said first conductor comprising a plurality of first portions with at least one of said first portions of said first conductor having a pair of spatially offset first conductor sections disposed on opposite sides of said axis and having a pair of first crossover sections, one of said first crossover sections interconnecting one of said first conductor sections to the other of said first conductor sections and the other of said first crossover sections being connected to said other of said first conductor sections; and a second flexible conductor disposed on said second side of said dielectric substrate, said second conductor comprising a plurality of second portions with at least one of said second portions of said second conductor having a pair of spatially offset second conductor sections disposed on opposite sides of said axis and having a pair of second crossover sections, one of said second crossover sections interconnecting one of said second conductor sections to the other of said second conductor sections and the other of said second crossover sections being connected to said other of said second conductor sections, each of said second crossover sections crossing one of said first crossover sections at a crossover point on opposite sides of said substrate, each of said first and second crossover sections decreasing in width uniformly as each of said crossover sections extends from one of said conductor sections toward one of said crossover points.

13. The flexible printed circuit member of claim 12 including flexible dielectric films covering said first and second flexible conductors.

14. The flexible printed circuit member of claim 12 wherein said first sections of said first conductor are substantially straight portions of said first conductor and are disposed generally parallel to said axis and said second sections of said second conductor are substantially straight portions of said second conductor and are disposed generally parallel to said axis.

15. The flexible printed circuit member of claim 12 including a plurality of sets of first and second flexible conductors.

16. The flexible printed circuit member of claim 12 wherein said first and second flexible conductors include electrical and mechanical interconnections through said dielectric substrate.

17. The flexible printed circuit member of claim 16 wherein said electrical and mechanical interconnection is achieved with vias extending through said dielectric substrate.

18. The flexible printed circuit member of claim 12 wherein said crossover points define a centerline along said axis.

19. A flexible circuit member comprising:

a generally planar, flexible dielectric substrate;

a pair of first and second flexible conductors on opposite sides of said substrate and extending longitudinally along said substrate in a generally periodic pattern wherein said first conductor has first crossover sections that cross over second crossover sections of said second conductor at crossover points separated by the dielectric substrate, the crossover points of said first and second conductors defining a centerline with the first and second conductors reversing each other on opposite sides of the centerline, each of said first and second crossover sections decreasing in width uniformly as said crossover section extends toward one of said crossover points.

20. The flexible circuit member of claim 19 including dielectric flexible films covering the outsides of said first and second conductors.

21. A flexible printed circuit member, comprising:

an elongated flexible dielectric substrate having first and second opposite sides;

a plurality of sets of first and second pseudo-twisted flexible conductors positioned on said dielectric substrate, each of said first pseudo-twisted conductors being on said first side of said substrate and each of said second pseudo-twisted conductors being on said second side of said substrate, each pseudo-twisted conductor having a generally periodic pattern with said first pseudo-twisted conductor being shifted longitudinally relative to its respective second pseudo-twisted conductor by one half of a period of said periodic pattern, each pair of said first and second pseudo-twisted conductors having crossover sections defining crossover points at which said first and second pseudo-twisted conductors cross over each other on opposite sides of said flexible dielectric substrate, each of said crossover sections decreasing in width uniformly as said crossover section extends toward said crossover point.

22. The flexible printed circuit member of claim 21 including flexible dielectric films covering said first and second pseudo-twisted conductors.

23. The flexible printed circuit member of claim 21 wherein said first conductor has substantially straight portions disposed generally parallel to said a centerline defined by said crossover points and said second conductor has substantially straight portions disposed generally parallel to said centerline.

24. The flexible printed circuit member of claim 23 wherein each set of said first and second pseudo-twisted conductors include electrical and mechanical interconnections through said dielectric substrate.

\* \* \* \* \*